(12) United States Patent
Zhu et al.

(10) Patent No.: US 11,923,490 B2
(45) Date of Patent: Mar. 5, 2024

(54) SEMICONDUCTOR LIGHT-EMITTING DEVICE

(71) Applicant: XIAMEN SAN'AN OPTOELECTRONICS TECHNOLOGY CO., LTD., Xiamen (CN)

(72) Inventors: Liqin Zhu, Xiamen (CN); Daquan Lin, Xiamen (CN); Lixun Yang, Xiamen (CN); Cheng Yu, Xiamen (CN)

(73) Assignee: QUANZHOU SAN'AN SEMICONDUCTOR TECHNOLOGY CO., LTD., Nanan (CN)

( * ) Notice: Subject to any disclaimer, the term of this patent is extended or adjusted under 35 U.S.C. 154(b) by 542 days.

(21) Appl. No.: 17/174,707

(22) Filed: Feb. 12, 2021

(65) Prior Publication Data

US 2021/0167265 A1   Jun. 3, 2021

Related U.S. Application Data

(63) Continuation-in-part of application No. PCT/CN2020/074015, filed on Jan. 23, 2020.

(30) Foreign Application Priority Data

Apr. 3, 2019   (CN) .......................... 201910266574.6

(51) Int. Cl.
*H01L 33/62*   (2010.01)
*H01L 33/38*   (2010.01)

(52) U.S. Cl.
CPC ............ *H01L 33/62* (2013.01); *H01L 33/382* (2013.01)

(58) Field of Classification Search
CPC ......... H01L 33/00–648; H01L 2933/00–0091; H01L 27/15–156
See application file for complete search history.

(56) References Cited

U.S. PATENT DOCUMENTS

2021/0135059 A1*   5/2021   Lee .......................... H01L 33/62

FOREIGN PATENT DOCUMENTS

CN   110021691 A   7/2019

OTHER PUBLICATIONS

Search Report issued to PCT application No. PCT/CN2020/074015 by the WIPO dated Apr. 21, 2020.

* cited by examiner

*Primary Examiner* — Mohammad A Rahman
(74) *Attorney, Agent, or Firm* — Thomas | Horstemeyer, LLP

(57) ABSTRACT

A semiconductor light-emitting device includes a substrate, a connection structure disposed on the substrate, a semiconductor light-emitting unit disposed on the connection structure, and first and second electrodes. The connection structure includes an insulating layer formed with a through hole, a first electrically connecting layer disposed on the insulating layer and electrically connected to the first electrode, and a second electrically connecting layer disposed between the substrate and the insulating layer and extending through the through hole to be electrically connected to the second electrode. A projection of the second electrode on the insulating layer covers a portion of the insulating layer.

23 Claims, 9 Drawing Sheets

SEMICONDUCTOR LIGHT-EMITTING DEVICE

CROSS-REFERENCE TO RELATED APPLICATION

This application is a bypass continuation-in-part application of International Application No. PCT/CN2020/074015 filed on Jan. 23, 2020, which claims priority of Chinese Invention Patent Application No. 201910266574.6, filed on Apr. 3, 2019. The entire content of each of the International and Chinese patent applications is incorporated herein by reference.

FIELD

The disclosure relates to a semiconductor light-emitting device, and more particularly to a semiconductor light-emitting device that can be operated at a high current and that exhibits an increased light-emitting efficiency.

BACKGROUND

A semiconductor light-emitting device includes a material capable of emitting light and is widely used in a lighting device, a display device, and a light source. In general, a conventional semiconductor light-emitting device includes a semiconductor light-emitting unit that contains a p-type semiconductor layer, an n-type semiconductor layer, and an active layer formed therebetween for emitting light. To be specific, electrons from the n-type semiconductor layer and holes from the p-type semiconductor layer undergo radiative recombination in the active layer to emit light. The conventional semiconductor light-emitting device might have any well-known chip structure, such as a horizontal (i.e., lateral) structure, e.g., a face-up structure and a flip-chip structure, and a vertical structure, based on the position of the p-type and n-type electrodes of the semiconductor light-emitting unit. In order to meet the requirements of high current density, a contact area between the electrodes and the semiconductor light-emitting unit needs to be enlarged, so as to achieve a good current spreading effect. However, such enlarged contact area would reduce an effective area of a light-emitting surface for the face-up and vertical structures (i.e., the light might be partially blocked by the electrodes). On the other hand, for the flip-chip structure, a substrate disposed on the light-emitting surface of the semiconductor light-emitting unit might absorb light emitted therefrom.

To prevent the emitted light from being blocked by the electrodes while maintaining a good current spreading effect, another conventional semiconductor light-emitting device has been developed by forming a connection structure to connect a backside of the semiconductor light-emitting unit to a substrate, and then disposing the electrodes on the connection structure to be electrically connected to the semiconductor light-emitting unit. Specifically, referring to FIGS. 1 and 3, such conventional semiconductor light-emitting device includes the substrate 912, the connection structure, the semiconductor light-emitting unit, a first electrode 913, and a second electrode 914.

The connection structure is disposed on the substrate 912, and includes an insulating layer 909, a first electrically connecting layer 908 that is disposed on the insulating layer 909 opposite to the substrate 912, and a second electrically connecting layer 910 that is disposed between the substrate 912 and the insulating layer 909. The semiconductor light-emitting unit includes a first type semiconductor layer 904, a light-emitting layer 903, and a second type semiconductor layer 902 that are sequentially disposed on the first electrically connecting layer 908 opposite to the insulating layer 909. The semiconductor light-emitting unit is formed with at least one recess 906 that extends through the first type semiconductor layer 904 and the light-emitting layer 903, and that terminates at and exposes the second type semiconductor layer 902. The second electrically connecting layer 910 further extends into the at least one recess 906 to electrically contact with the second type semiconductor layer 902. The first and second electrodes 913, 914 are disposed on the first electrically connecting layer 908 opposite to the insulating layer 909, and are respectively electrically connected to the first type semiconductor layer 904 through the first electrically connecting layer 908 and electrically connected to the second type semiconductor layer 902 through the second electrically connecting layer 910. The insulating layer 909 is formed with one through hole 9091 that is positioned exactly under a central region of the second electrode 914. The second electrically connecting layer 910 includes an extending part 9101 that fills the through hole 9091.

However, since the through hole 9091 might have a relatively large diameter and a metallic material of the second electrically connecting layer 910 might unevenly fill the through hole 9091, the resultant extending part 9101 might be vulnerable to the formation of a plurality of voids (see FIG. 1) that might reduce the structural strength thereof, and thus the second electrode 914 cannot be stably supported by the extending part 9101 and would be susceptible to damage (such as collapse and breakage) during wire bonding (see FIG. 2).

SUMMARY

Therefore, an object of the disclosure is to provide a semiconductor light-emitting device that can alleviate or eliminate at least one of the drawbacks of the prior art.

According to the disclosure, the semiconductor light-emitting device includes a substrate, a connection structure, a semiconductor light-emitting unit, and a first electrode and a second electrode that are adapted for external wire bonding.

The connection structure is disposed on the substrate, and includes an insulating layer, a first electrically connecting layer that is disposed on the insulating layer opposite to the substrate, and a second electrically connecting layer that is disposed between the substrate and the insulating layer.

The semiconductor light-emitting unit includes a first type semiconductor layer, a light-emitting layer, and a second type semiconductor layer that are sequentially disposed on the first electrically connecting layer opposite to the insulating layer.

The first electrode is electrically connected to the first type semiconductor layer through the first electrically connecting layer. The second electrode is electrically connected to the second type semiconductor layer through the second electrically connecting layer. The semiconductor light-emitting unit and the first and second electrodes are located on a same side of the substrate. The insulating layer is formed with at least one through hole. The second electrically connecting layer includes an extending part that extends through the at least one through hole to be electrically connected to the second electrode, such that a projection of the second electrode on the insulating layer covers a portion of the insulating layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
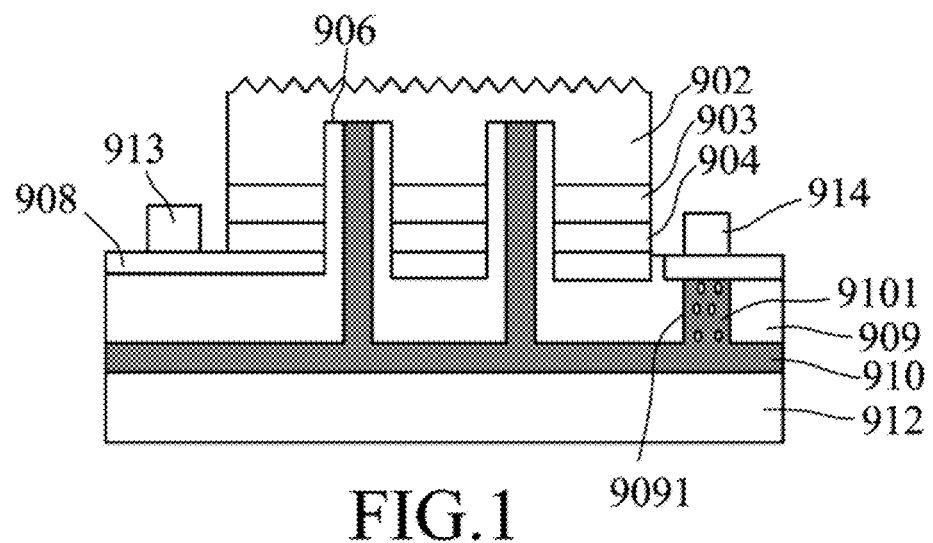
FIGS. 1 and 2 are schematic views illustrating a conventional semiconductor light-emitting device.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted that, directional terms, such as "vertical," "horizontal," "top," "bottom," "upper," "lower," "inner," "inwardly," "outer," and "outwardly," "front," "rear," "left," "right", "top" and "bottom," may be used to assist in describing the disclosure based on the orientation of the embodiments shown in the figures. The use of these directional definitions should not be interpreted to limit the disclosure in any way.

Figure 4:
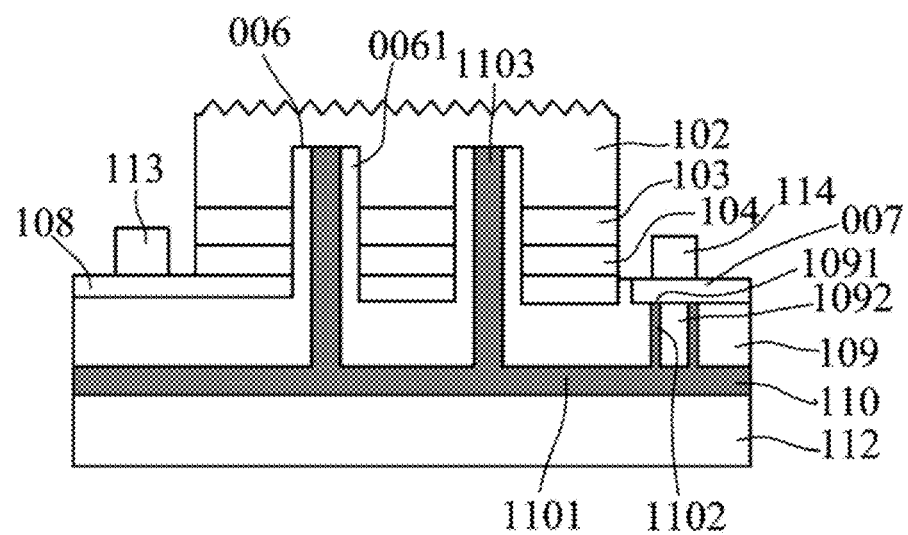
FIG. 4 is a schematic view illustrating a first embodiment of a semiconductor light-emitting device according to the disclosure.

Referring to FIG. 4, a first embodiment of a semiconductor light-emitting device according to the disclosure includes a substrate 112, a connection structure, a semiconductor light-emitting unit, a first electrode 113, and a second electrode 114.

The substrate 112 may be made of an insulating material such as AlN and $Al_2O_3$. Alternatively, the substrate 112 may be made of a conductive material such as Si, SiC, and a metal or a metal alloy (e.g., Cu or CuW). The substrate 112 is adapted for supporting the connection structure and the semiconductor light-emitting unit.

The connection structure includes an insulating layer 109 disposed on the substrate 112, a first electrically connecting layer 108 disposed on the insulating layer 109 opposite to the substrate 112, and a second electrically connecting layer 110 disposed between the substrate 112 and the insulating layer 109.

The semiconductor light-emitting unit includes a first type semiconductor layer 104, a light-emitting layer 103, and a second type semiconductor layer 102 sequentially disposed on the first electrically connecting layer 108 opposite to the insulating layer 109. The first type semiconductor layer 104 may be made of one of an n-type semiconductor material and a p-type semiconductor material, and the second type semiconductor layer 102 may be made of the other one of the n-type semiconductor material and the p-type semiconductor material. In this embodiment, the first type semiconductor layer 104 is made of an n-type semiconductor material for providing electrons to the light-emitting layer 103, and the second type semiconductor layer 102 is made of a p-type semiconductor material for providing holes to the light-emitting layer 103. The light-emitting layer 103 is a semiconductor layer that at least emits a light radiation having a predetermined wavelength. For example, the semiconductor light-emitting unit may be made of a gallium nitride-based semiconductor material which may further include Al and/or In, and is configured to emit light having an emission peak wavelength ranging from 200 nm to 550 nm (i.e., the wavelength range of ultraviolet light, blue light, or green light). Alternatively, the semiconductor light-emitting unit may be made of an aluminum gallium indium phosphide (AlGaInP)-based semiconductor material or an aluminum gallium arsenide (AlGaAs)-based semiconductor material which is configured to emit light having an emission peak wavelength ranging from 550 nm to 950 nm (i.e., the wavelength range of yellow light, orange light, red light, or infrared light). In this embodiment, the semiconductor light-emitting unit is made of a gallium nitride-based semiconductor material.

The first electrically connecting layer 108 may be formed as one of a single layer structure and a multi-layered structure. The first electrically connecting layer 108 is disposed on a side of the first type semiconductor layer 104 that is opposite to the light-emitting layer 103, and is electrically connected to the first type semiconductor layer 104 and the first electrode 113. The first electrically connecting layer 108 may be made of a conductive material such as a metal (e.g., Au, Ag, Al, Ni, Ti, Pt, Cr), a metal alloy or an oxide thereof, an inorganic oxide (e.g., IZO or ITO), and combinations thereof.

The second electrically connecting layer 110 may be formed as one of a single layer structure and a multi-layered structure. The second electrically connecting layer 110 is electrically connected to the second type semiconductor layer 102. The second electrically connecting layer 110 may be made of a conductive material to form an ohmic contact with the second type semiconductor layer 102. Examples of the conductive material for making the second electrically connecting layer 110 may include, but are not limited to, a metal (e.g., Al or Ni), a metal alloy (e.g., aluminium-chromium), a light-transmissive inorganic compound (e.g. indium zinc oxide (IZO) or indium titanium oxide (ITO)), and combinations thereof. In this embodiment, the second electrically connecting layer 110 is made of aluminium-chromium. The second electrically connecting layer 110 may have a thickness ranging from 100 nm to 500 nm. It is noted that the thickness of the second electrically connecting layer 110 may be adjusted to achieve an optimal ohmic contact.

The insulating layer 109 may be formed as one of a single layer structure and a multi-layered structure. The insulating layer 109 is configured to electrically isolate the second electrically connecting layer 110 and the first electrically connecting layer 108 from each other. In order to effectively support the second electrode 114, the insulating layer 109 may be made of a dielectric material selected from the group consisting of a nitride (e.g., silicon nitride), an oxide (e.g., silicon dioxide, zinc oxide, or aluminium oxide), a fluoride, and combinations thereof. The insulating layer 109 may have a thickness that is measured from the first electrically connecting layer 108 to the second electrically connecting layer 110, and that ranges from 100 nm to 5000 nm. In certain embodiments, the thickness of the insulating layer 109 may range from 500 nm to 5000 nm, such as 600 nm to 1000 nm. The insulating layer 109 may have a Mohs hardness that is not smaller than 6. In certain embodiments, the insulating layer 109 may have a Mohs hardness that is not smaller than 7. In other embodiments, the insulating layer 109 may have a Mohs hardness that is not smaller than 8.

The first electrode 113 and the second electrode 114 are adapted for external wire bonding. The first electrode 113 is electrically connected to the first type semiconductor layer 104 through the first electrically connecting layer 108. The second electrode 114 is electrically connected to the second type semiconductor layer 102 through the second electrically connecting layer 110. In this embodiment, the first electrode 113, the second electrode 114 and the semiconductor light-emitting unit are located on a same side of the substrate 112.

The insulating layer 109 is formed with at least one through hole 1091. The second electrically connecting layer 110 includes an extending part 1102 that extends through the at least one through hole 1091 to be electrically connected to the second electrode 114, such that a projection of the second electrode 114 on the insulating layer 109 covers a portion 1092 of the insulating layer 109.

In certain embodiments, the through hole 1091 is not located at a position that is exactly under a center of the second electrode 114. That is, a geometrical center line of the second electrode 114 is not aligned with a geometrical centerline of the through hole 1091.

The at least one through hole 1091 may be formed in a columnar shape or a cone shape. Alternatively, the at least one through hole 1091 may have a loop cross section which may be an open-loop cross section or a closed-loop cross section.

In this embodiment, the loop cross section is a closed-loop cross section, and the portion 1092 of the insulating layer 109 is separated from a remaining portion of the insulating layer 109 by the second electrically connecting layer 110. The portion 1092 of the insulating layer 109 surrounded by the at least one through hole 1091 is configured to support the second electrode 114. An area of the portion 1092 of the insulating layer 109 to an area of the projection of the second electrode 114 on the insulating layer 109 may be present in a ratio of not smaller than 1:4. In certain embodiments, the area of the portion 1092 of the insulating layer 109 to the area of the projection of the second electrode 114 on the insulating layer 109 may be present in a ratio of not smaller than 1:2 and not greater than 1:1, e.g., 4:5 and 5:6.

In certain embodiments, the insulating layer 109 is formed with a plurality of the through holes 1091, and the extending part 1102 extends through the through holes 1091. The insulating layer 109 disposed between the through holes 1091 are configured to support the second electrode 114.

In certain embodiments, the extending part 1102 may be located at a position that is more adjacent to a periphery of the projection of the second electrode 114 on the insulating layer 109 than to a center of the projection of the second electrode 114 on the insulating layer 109. The extending part 1102 may fall outside the projection of the second electrode 114 on the insulating layer 109.

In other embodiments, a projection of the extending part 1102 on the insulating layer 109 may partially overlap with the projection of the second electrode 114 on the insulating layer 109.

In certain embodiments, an area of the projection of the second electrode 114 on the insulating layer 109 having a diameter that is at least half of a distance between two opposite ends of the projection may overlap with the portion 1092 of the insulating layer 109.

In certain embodiments, an area of the projection of the second electrode 114 on the insulating layer 109 and an area of a cross-section of the at least one through hole 1091 (which is substantially equal to an area of a projection of the extending part 1102 on the insulating layer 109) may be present in a ratio that ranges from 4:5 to 1:1. In certain embodiments, the cross-section of the at least one through hole 1091 may have an average diameter that is not smaller than 10 µm. It is noted that the size of the at least one through hole 1091 can be designed and adjusted according to the size of the second electrode 114.

The semiconductor light-emitting unit may further include at least one recess 006 that is defined by a recess-defining wall 0061 and that is exposed from the first electrically connecting layer 108. The at least one recess 006 extends through the first type semiconductor layer 104 and the light-emitting layer 103, and terminates at and exposes the second type semiconductor layer 102. The second electrically connecting layer 110 further extends into the recess 006 to electrically contact with the second type semiconductor layer 102. The insulating layer 109 further covers the recess-defining wall 0061, and is disposed between and electrically isolates the second electrically connecting layer 110 and the semiconductor light-emitting unit.

In certain embodiments, the semiconductor light-emitting unit has a plurality of the recesses 006 (e.g., 2 to 50000 recesses 006) that may have the same or different size. The recesses 006 may be equally or not equally spaced apart from one another. A center of each of the recesses 006 may be spaced apart from a center of an immediately adjacent recess 006 by a spacing that ranges from 5 µm to 500 µm. Each of the recesses 006 may have an average size ranging from 1 µm to 100 µm. In certain embodiments, the recesses 006 have a total cross-sectional area accounting for 0.5% to 20% of an area of a projection of the first type semiconductor layer 104 on the substrate 112.

To be specific, according to the position in the semiconductor light-emitting device, the second electrically connecting layer 110 includes a first part and the extending part 1102. The first part includes a horizontal region 1101 that is disposed on the substrate 112, and a vertical region 1103 that extends from the horizontal region 1101 upwardly into the recesses 006 to be electrically connected to the second type semiconductor layer 102. The extending part 1102 extends through the at least one through hole 1091 to be electrically connected to the second electrode 114. The insulating layer 109 is configured to electrically isolate the first part of the second electrically connecting layer 110, the light-emitting layer 103 of the semiconductor light-emitting unit, and the first type semiconductor layer 104 from one another. The horizontal region 1101, the vertical region 1103, and the extending part 1102 may be made of the same material.

The connection structure may further optionally include a third electrically connecting layer 007 disposed between the extending part 1102 of the second electrically connecting layer 110 and the second electrode 114. That is, the third electrically connecting layer 007 has two opposite sides respectively for electrically contacting with the extending part 1102 of the second electrically connecting layer 110 and the second electrode 114. The third electrically connecting layer 007 and the first electrically connecting layer 108 may be formed in one step. In a case that the first electrically connecting layer 108 is formed as a multi-layered structure, the third electrically connecting layer 007 may be made of a material the same as that of at least one of the layers of the first electrically connecting layer 108. The third electrically connecting layer 007 is electrically isolated from the first electrically connecting layer 108.

Referring to FIGS. 5 to 14, a method for manufacturing a second embodiment of the semiconductor light-emitting device according to the disclosure is described as follows. The second embodiment of the semiconductor light-emitting device is generally similar to the first embodiment, except that in the second embodiment, the first electrically connecting layer 108 is formed as a multi-layered structure which includes an ohmic contact sublayer 105, a reflection sublayer 107, and a metal blocking sublayer.

Figure 5:
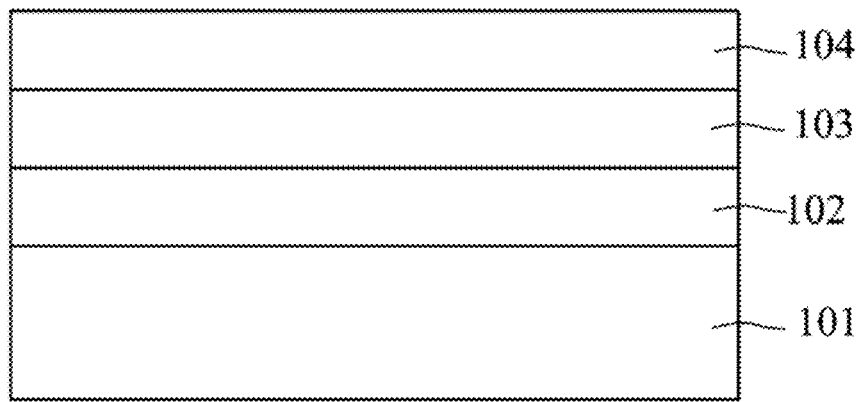
FIGS. 5 to 14 are schematic views illustrating consecutive steps of a method for manufacturing a second embodiment of the semiconductor light-emitting device according to the disclosure.

Specifically, referring to FIG. 5, a semiconductor epitaxial structure is first provided. The semiconductor epitaxial structure includes a growth substrate 101 and the semiconductor light-emitting unit. The growth substrate 101 may be an epitaxial growth substrate capable of growing the semiconductor light-emitting unit. Examples of a material for making the growth substrate 101 may include, but are not limited to, sapphire, silicon (Si), gallium phosphide (GaP), gallium arsenide (GaAs), indium phosphide (InP), and combinations thereof. In this embodiment, the growth substrate 101 is made of sapphire.

It is noted that before the growth of the semiconductor light-emitting unit, an additional layer such as a buffer layer, a transition layer, and an etch stop layer may be optionally grown on the growth substrate 101 so as to obtain an optimal lattice match between the semiconductor light-emitting unit and the growth substrate 101, which is conducive for the subsequent removal of the growth substrate 101.

Figure 6:
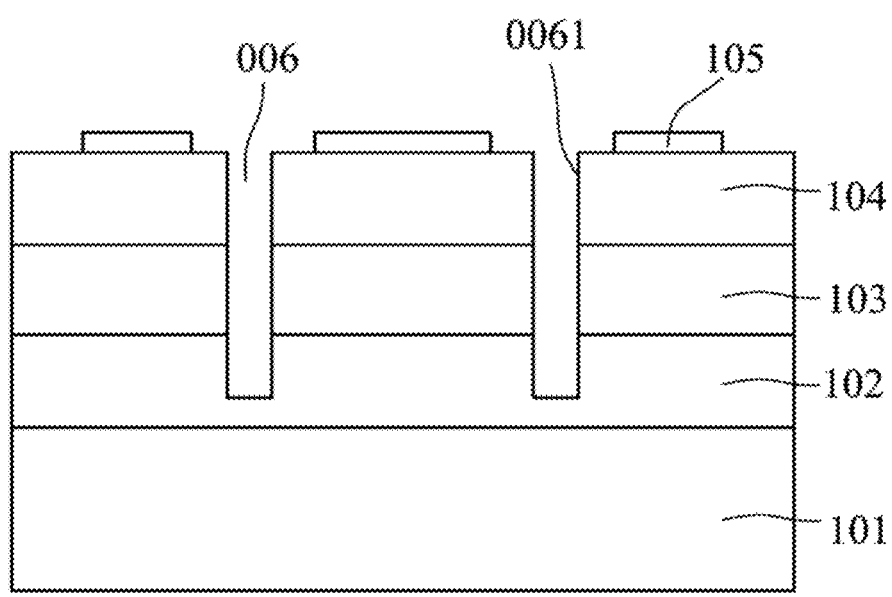
Figure 7:
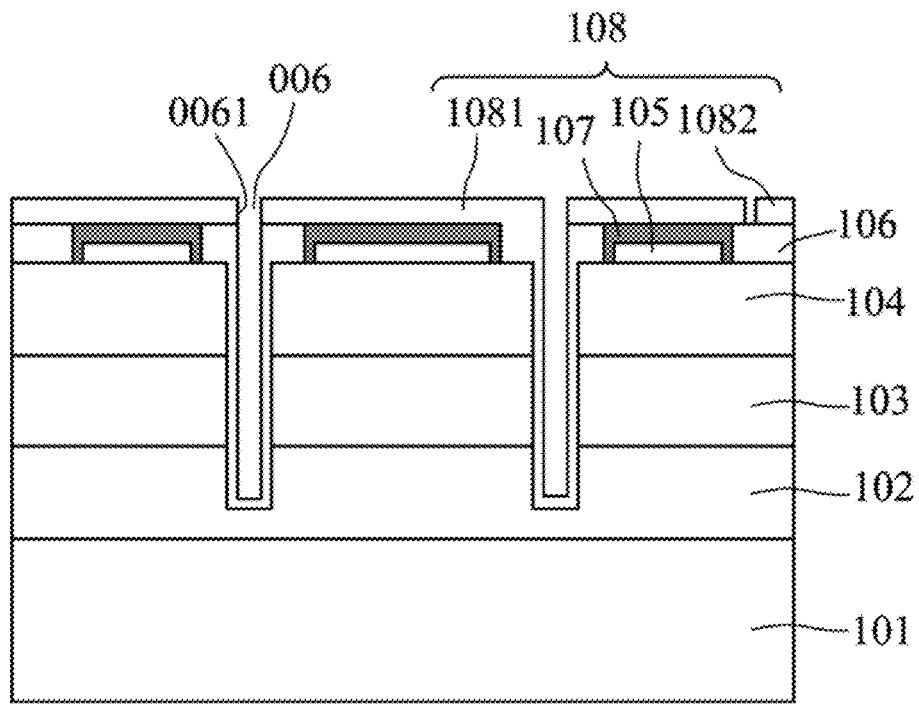
Figure 8:
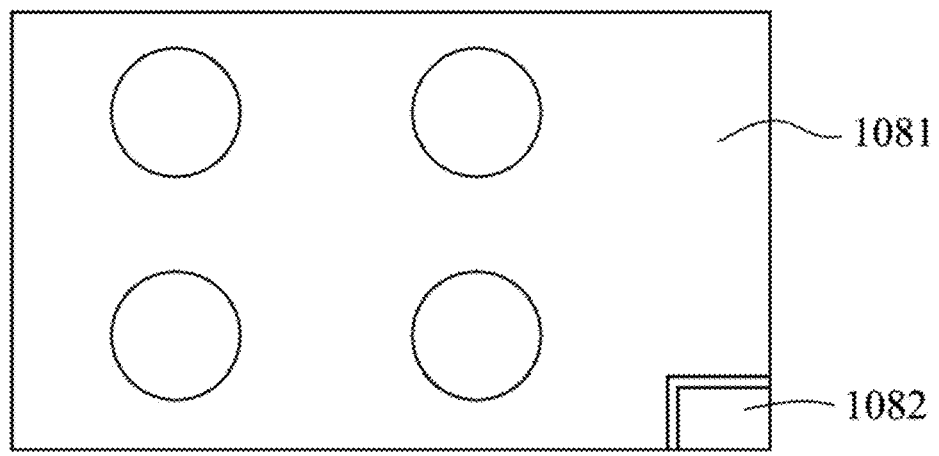

Referring to FIGS. 6 to 8, the semiconductor light-emitting unit is etched from the first type semiconductor layer 104 to expose the second type semiconductor layer 102 and to form the at least one recess 006. Then, the first electrically connecting layer 108 is formed on and electrically connected to the first type semiconductor layer 104.

To be specific, in this embodiment, the ohmic contact sublayer 105 is first disposed on the first type semiconductor layer 104 to ensure that a desired ohmic contact is formed therebetween. The ohmic contact sublayer 105 may be made of a light-transmissive metal oxide (e.g. ITO, or Ga-doped ZnO (GZO)), or a metal (e.g., Al, Cr or Ti). The ohmic contact sublayer 105 may have a thickness ranging from 1 nm to 100 nm, such as ranging from 1 nm to 20 nm or ranging from 1 nm to 10 nm.

Afterwards, the reflection sublayer 107 is disposed over the ohmic contact sublayer 105. The reflection sublayer 107 is configured to effectively reflect a light radiation that is emitted from the light-emitting layer 103 towards the ohmic contact sublayer 105 of the first electrically connecting layer 108. The reflection sublayer 107 may include a reflective metallic material, and optionally a light-transmissive inorganic compound. The reflective metallic material may include at least one metal having a high reflectivity, such as Al, Au and Ag. The light-transmissive inorganic compound may include one of an oxide (e.g., ITO, or IZO), a nitride, and a combination thereof. In certain embodiments, the reflection sublayer 107 may have a reflectivity that is not smaller than 50% for the light radiation emitted from the light-emitting layer 103. In other embodiments, the reflection sublayer 107 may have a reflectivity that is not smaller than 80% for the light radiation emitted from the light-emitting layer 103. The reflection sublayer 107 may have a thickness ranging from 50 nm to 500 nm.

Thereafter, the metal blocking sublayer is disposed on the reflection sublayer 107 for preventing diffusion of the metal atoms (e.g., Al or Ag) of the reflection sublayer 107. The ohmic contact sublayer 105, the reflection sublayer 107 and the metal blocking sublayer cooperatively form the first electrically connecting layer 108.

Examples of a material for making the metal blocking sublayer may include, but are not limited to, Pt, Au, Cr, Ti, and combinations thereof. The metal blocking sublayer may have a thickness ranging from 100 nm to 1000 nm. In this embodiment, the metal blocking sublayer includes the first blocking part 1081 and the second blocking part 1082 that are spaced apart from each other by a gap. Such gap may be filled by the material of the insulating layer 109 in a subsequent step so as to electrically isolate the first blocking part 1081 and the second blocking part 1082 from each other. In certain embodiments, the first blocking part 1081 of the metal blocking sublayer may serve as a portion of the first electrically connecting layer 108, and the second blocking part 1082 of the metal blocking sublayer may serve as the third electrically connecting layer 007 of the first embodiment (see FIG. 4). The reflection sublayer 107 is covered by the first blocking part 1081. By virtue of forming the first blocking part 1081 and the second blocking part 1082, the first electrode 113 and the second electrode 114 to be formed in a latter step can be assured to be disposed at a same height (see FIG. 13). That is, a distance of a bottom end of the first electrode 113 to the substrate 112 may be equal to a distance of a bottom end of the second electrode 114 to the substrate 112, which is conducive for external wire bonding to be performed subsequently.

In certain embodiments, during the formation of the the first electrically connecting layer 108, a passivation layer 106 is disposed between the metal blocking sublayer and the semiconductor light-emitting unit. The passivation layer 106 may cover a portion of the semiconductor light-emitting unit, and may further extend into and cover the recess-defining wall 0061 of the at least one recess 006. In certain embodiments, the passivation layer 106 may be formed between the ohmic contact sublayer 105 and the reflection sublayer 107. The passivation layer 106 may be made of an electrical insulating material, such as a nitride (e.g., silicon nitride), and an oxide (e.g., silicon dioxide). The passivation layer 106 may be formed with at least one opening to expose the ohmic contact sublayer 105, such that the reflection sublayer 107 can be filled in the opening to contact with the ohmic contact sublayer 105.

Figure 9:
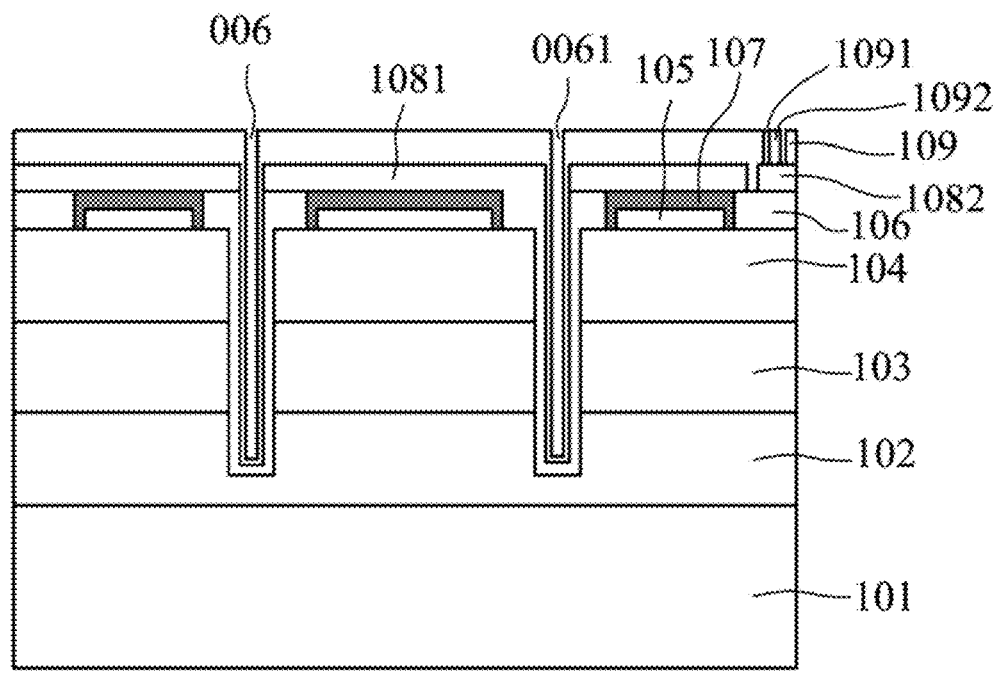

Referring to FIG. 9, the insulating layer 109 is provided to cover the recess-defining wall 0061 of the at least one recess 006 and the metal blocking sublayer of the first electrically connecting layer 108. In addition, the insulating layer 109 is filled in the gap between the first blocking part 1081 and the second blocking part 1082 of the metal blocking sublayer. The insulating layer 109 may be formed by chemical vapor deposition (CVD). The insulating layer 109 may be made of a material identical to or different from that of the passivation layer 106. In this embodiment, the insulating layer 109 is made of silicon nitride.

After forming the insulating layer 109, a portion of the insulating layer 109 that corresponds in position to the recess 006 and the passivation layer 106 that is disposed under the portion of the insulating layer 109 are removed by etching (e.g., buffered oxide etch (BOE)), so as to expose the second type semiconductor layer 102. In addition, another portion of the insulating layer 109 that corresponds in position at which the second electrode 114 is being disposed (i.e., an area surrounded by the dotted lines shown in FIG. 10) is etched to form the at least one through hole 1091. The at least one through hole 1091 is located above the second blocking part 1082 of the metal blocking sublayer.

Figure 10:
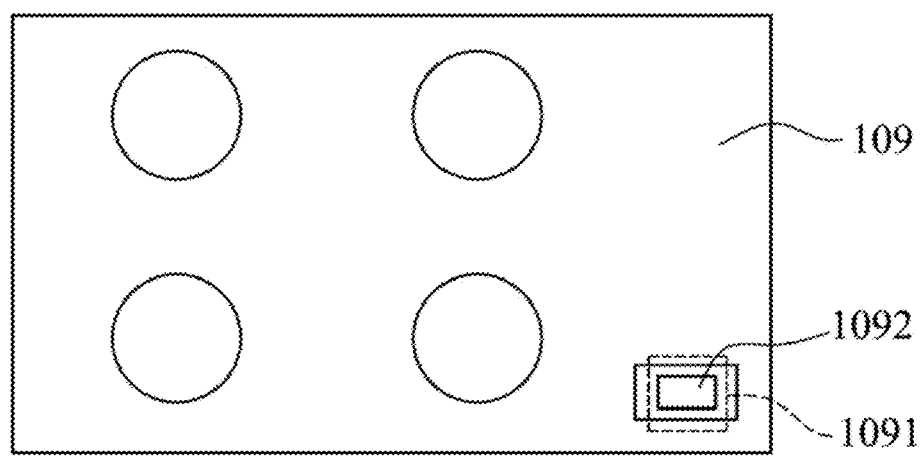

Further referring to FIG. 10, in this embodiment, the at least one through hole 1091 has a closed-loop cross section. The portion 1092 of the insulating layer 109 is separated from a remaining portion of the insulating layer 109 by the through hole 1091. The second electrode 114 is to be formed on the area surrounded by the dotted lines. Therefore, the portion 1092 of the insulating layer 109 is designed to be located under the second electrode 114 for effectively supporting the second electrode 114.

Figure 11:
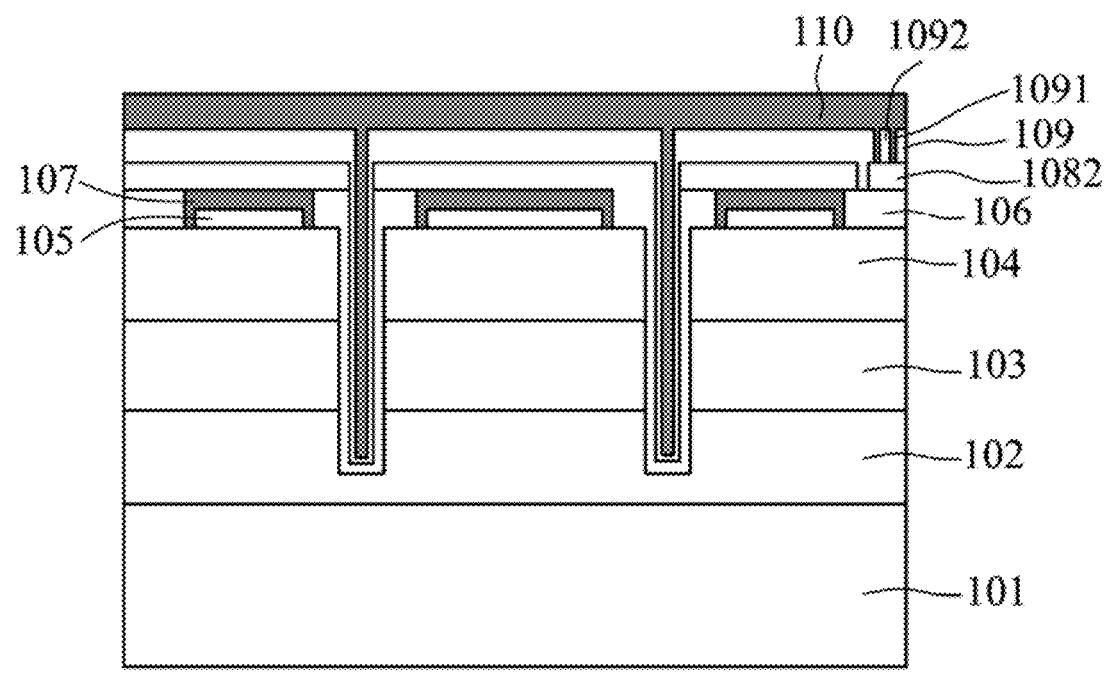

Referring to FIG. 11, the second electrically connecting layer 110 is provided to cover the insulating layer 109, and to fill the recess 006 so as to electrically connect with the second type semiconductor layer 102, and to fill the at least one through hole 1091.

Figure 12:
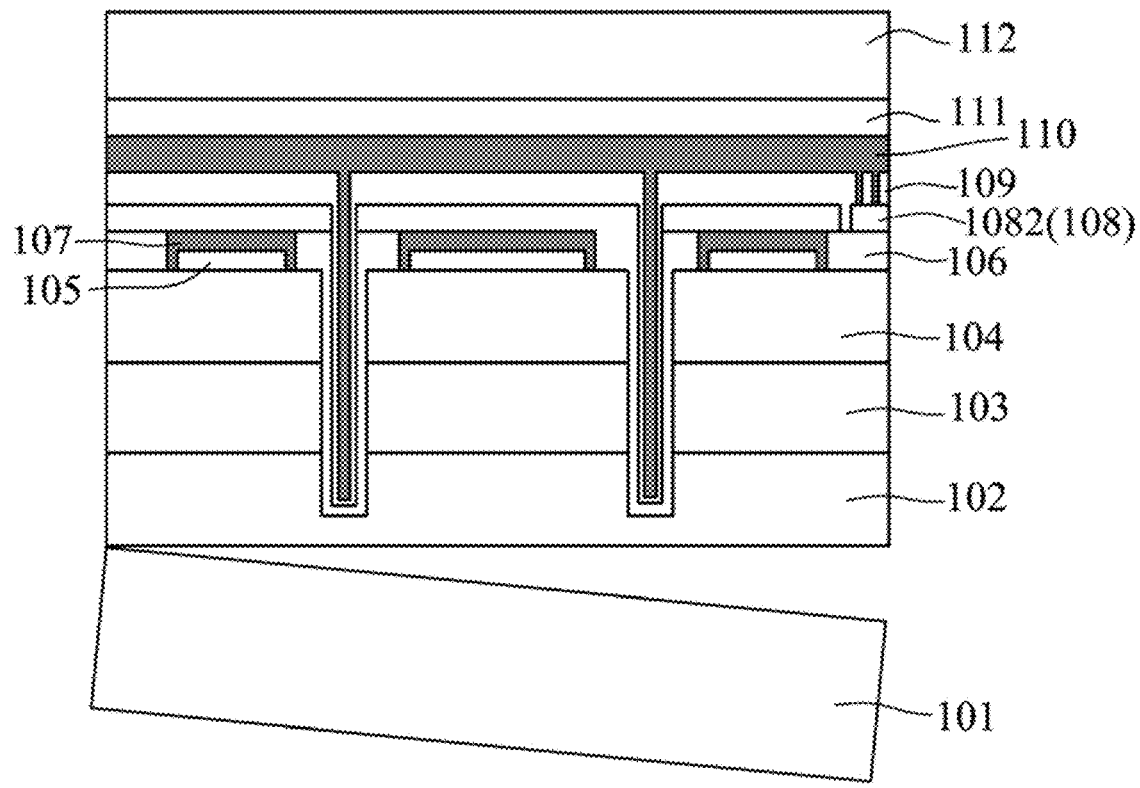

Referring to FIG. 12, the substrate 112 is disposed on and bonded to the second electrically connecting layer 110 opposite to the insulating layer 109. A bonding layer 111 may be further interposed between the substrate 112 and the second electrically connecting layer 110 for assisting the bonding thereof. The bonding process may be implemented at a high temperature. The bonding layer 111 may be formed as one of a single layer structure and a multi-layered structure. The bonding layer 111 may be made of a metallic material having bonding properties, such as a metal or a metal alloy (e.g., gold-tin, nickel-tin, titanium-nickel-tin, and combinations thereof). In such case, the bonding layer 111 may be integrally formed with the second electrically connecting layer 110. That is, the second electrically connecting layer 110 may further include the metallic material having bonding properties to serve as the bonding layer 111. Alternatively, the bonding layer 111 may be made of an insulating inorganic material such as silicon oxide, silicon carbide, or aluminium oxide, and thus, is formed separately from the second electrically connecting layer 110.

Figure 13:
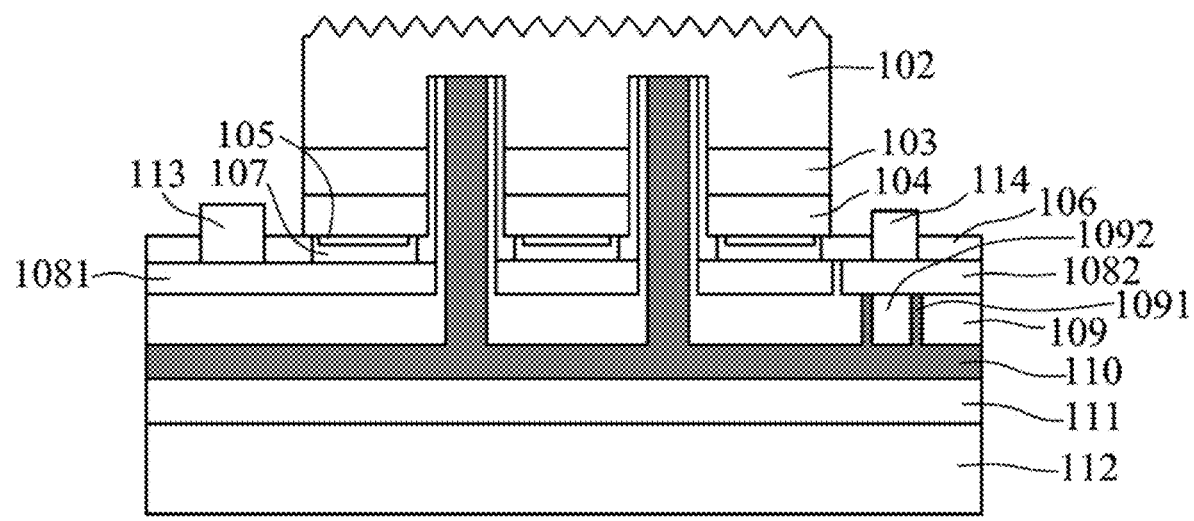
Figure 14:
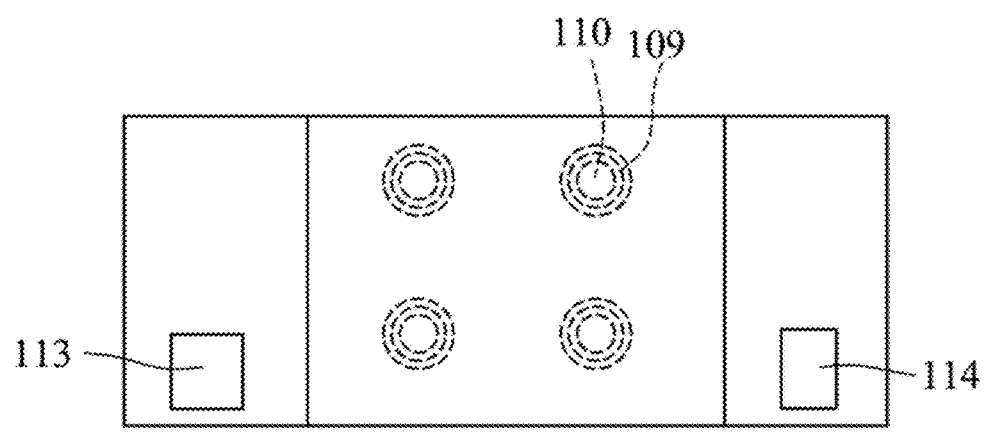

Referring to FIGS. 13 and 14, the growth substrate 101 is removed from the semiconductor light-emitting unit. According to the selected material for making the growth substrate 101, the process for removing the growth substrate 101 may include, but is not limited to, grinding, laser liftoff, wet etching, dry etching, and combinations thereof. For example, the growth substrate 101 made of sapphire may be removed by grinding or laser liftoff. The growth substrate 101 made of GaAs-based material may be removed by wet etching.

Then, the semiconductor light-emitting unit is subjected to an etching process from the second type semiconductor layer 102 towards the first type semiconductor layer 104 to partially expose the first blocking part 1081 and the second blocking part 1082 of the metal blocking sublayer, on which the first electrode 113 and the second electrode 114 are respectively disposed. In addition, the second type semiconductor layer 102 of the semiconductor light-emitting unit may be subjected to a surface roughening treatment to form a roughed light existing surface for enhancing the efficiency of light emission and extraction. A top portion and/or a side portion of the second type semiconductor layer 102 may be covered with a light-transmissive protective layer for preventing water vapor from entering thereinto and for achieving electrical isolation. Such light-transmissive protective layer may be made of silicon dioxide or silicon nitride.

In this embodiment, the semiconductor light-emitting device includes one first electrode 113 and one second electrode 114. In other embodiments, the semiconductor light-emitting device may have at least two first electrodes 113 and at least two second electrodes 114.

In certain embodiments, by virtue of further etching the semiconductor light-emitting unit, the first electrically connecting layer 108, the insulating layer 109 and the second electrically connecting layer 110, and then cutting the substrate 112 along a predetermined cutting path, a plurality of the semiconductor light-emitting devices separated from one another are thereby obtained.

Figure 15:
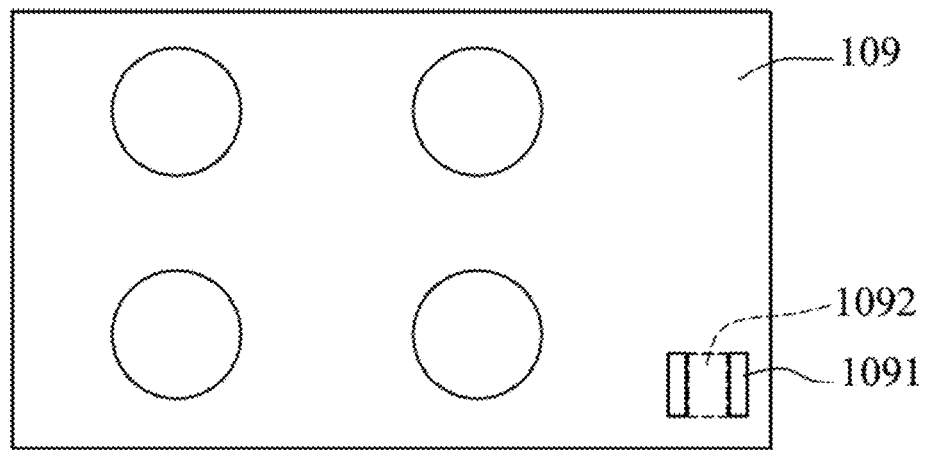
FIG. 15 is a schematic cross-sectional view illustrating an insulating layer of a third embodiment of the semiconductor light-emitting device according to the disclosure.

Referring to FIG. 15, a third embodiment of the semiconductor light-emitting device according to the disclosure is generally similar to the second embodiment, except that in the third embodiment, the insulating layer 109 is formed with two through holes 1091 that are spaced apart from each other. The portion 1092 of the insulating layer 109 disposed between the two through holes 1091 (i.e., located in an area surrounded by the dotted lines) is configured to support the second electrode 114. The portion 1092 of the insulating layer 109 mainly or entirely covers the projection of the second electrode 114 on the insulating layer 109. A distance between the two through holes 1091 may be at least 50% of a distance between two opposite ends of the projection of the second electrode 114 on the insulating layer 109. The two through holes 1091 may have a total cross sectional area that is equal to a cross sectional area of the through hole 1091 having the closed-loop cross section in the first embodiment, or may be equal to a cross sectional area of the through hole 9091 in the conventional semiconductor light-emitting device shown in FIG. 1. In such case, as compared to the conventional semiconductor light-emitting device, the two through holes 1091 in this embodiment may have a reduced width, such that the metallic material can be more densely filled in the through holes 1091, so as to reduce the formation of voids in the resultant extending part 1102 of the second electrically connecting layer 110, thereby effectively avoiding damage of the extending part 1102 during wire bonding.

Figure 16:
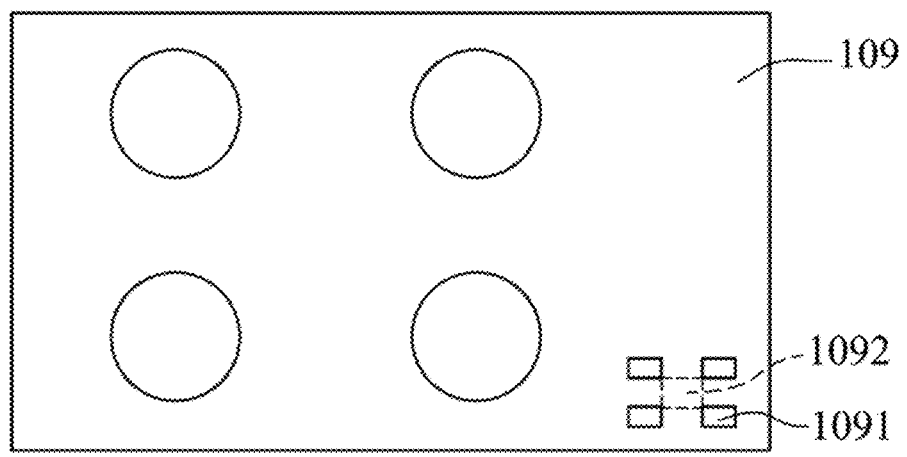
FIG. 16 is a schematic cross-sectional view illustrating an insulating layer of a variation of the third embodiment.

Referring to FIG. 16, in a variation of the third embodiment, the insulating layer 109 is formed with four through holes 1091 that are spaced apart from one another, and that cooperatively define a central region (i.e., an area surrounded by the dotted lines) where the portion 1092 of the insulating layer 109 is disposed to support the second electrode 114. An area of the portion 1092 of the insulating layer 109 to an area of the projection of the second electrode 114 on the insulating layer 109 may have a ratio ranging from 1:4 to 1:1.

Figure 17:
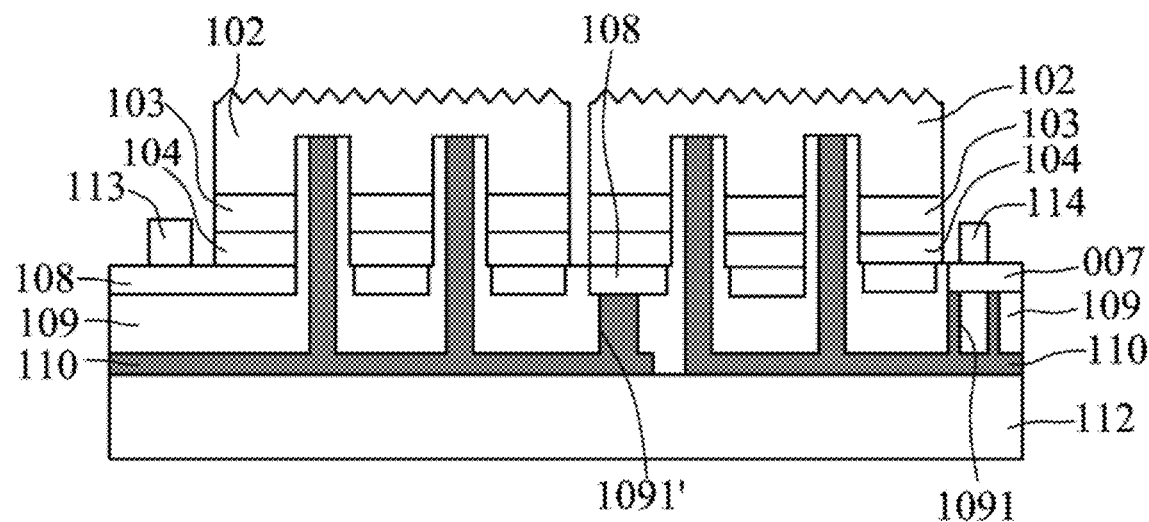
FIG. 17 is a schematic view illustrating a fourth embodiment of the semiconductor light-emitting device according to the disclosure.

Referring to FIG. 17, a fourth embodiment of the semiconductor light-emitting device according to the disclosure is generally similar to the first embodiment, except for the following differences.

First, in the fourth embodiment, the semiconductor light-emitting device includes at least two semiconductor light-emitting units that are spaced apart from each other and that are electrically connected in series through the connection structure. The connection structure includes at least two first electrically connecting layers 108, at least two second electrically connecting layers 110 and the third electrically connecting layer 007 that are electrically isolated from one another by the insulating layer 109. Each of the first electrically connecting layers 108 is disposed on and electrically connected to a respective one of the first type semiconductor layers 104 of the at least two semiconductor light-emitting units. Each of the second electrically connecting layers 110 is electrically connected to a respective one of the second type semiconductor layers 102 of the at least two semiconductor light-emitting units. The first electrically connecting layer 108 which is disposed on one of the semiconductor light-emitting units, is electrically connected to the second electrically connecting layer 110 which is disposed on an immediately adjacent one of the semiconductor light-emitting units, in such a manner that the at least two semiconductor light-emitting units are electrically connected in series. Specifically, the insulating layer 109 located under the first electrically connecting layer 108 (disposed on the one of the semiconductor light-emitting units) is further formed with a through hole, and the second electrically connecting layer 110 disposed on the immediately adjacent one of the two semiconductor light-emitting units extends through the through hole to be electrically connected to the first electrically connecting layer 108.

In addition, the first electrode 113 is electrically connected to the first electrically connecting layer 108 that is not electrically connected to any one of the second electrically connecting layers 110 (i.e., disposed on a first one of the serially connected semiconductor light-emitting units). The second electrode 114 is electrically connected to the third electrically connecting layer 007 and the second electrically connecting layer 110 that is not electrically connected to any one of the first electrically connecting layers 108 (i.e., disposed on the last one of the serially connected semiconductor light-emitting units). The first and second electrodes 113, 114 are located on a same side of the substrate 112.

Figure 18:
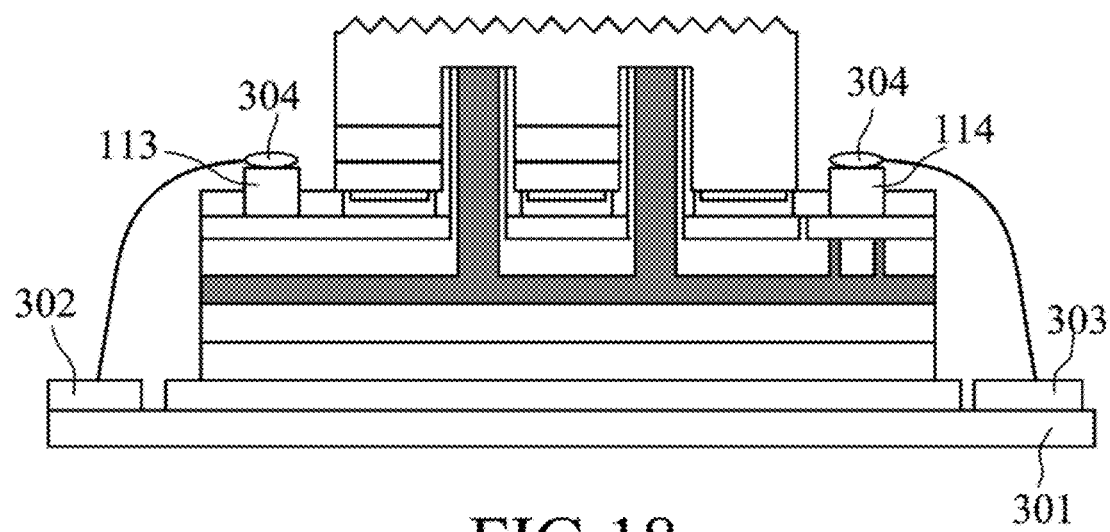
FIG. 18 is a schematic view illustrating a packaging product according to this disclosure which includes the second embodiment of the semiconductor light-emitting device.

The semiconductor light-emitting device according to the disclosure may be manufactured into a packaging product for widespread use in lighting and display fields with high current requirement, such as a backlight and a flashlight. Referring to FIG. 18, a packaging product according to this disclosure includes a packaging substrate 301 that is formed with a circuit layer, and the second embodiment of the semiconductor light-emitting device that is mounted on the packaging substrate 301 through e.g., a binding material. The packaging substrate 301 may be a flat substrate or may have a recess for receiving the semiconductor light-emitting device. The circuit layer of the packaging substrate 301 may include a first circuit part 302 and a second circuit part 303 that are electrically isolated from each other and that are respectively configured for external wire bonding of the first electrode 113 and the second electrode 114.

The semiconductor light-emitting device may further have two wire bonding electrodes 304 that are respectively bonded to the first electrode 113 and the second electrode 114 for external wire bonding. The bonding portion 304 of each of the first and second electrodes 113, 114 may have a ball shape or an ellipsoidal shape, and is electrically connected to the circuit layer of the packaging substrate 301 through a metal lead. In addition, the semiconductor light-emitting device may be further covered and sealed by a packaging layer. Such packaging layer may be made of a resin material which optionally includes a phosphor.

Figure 2:
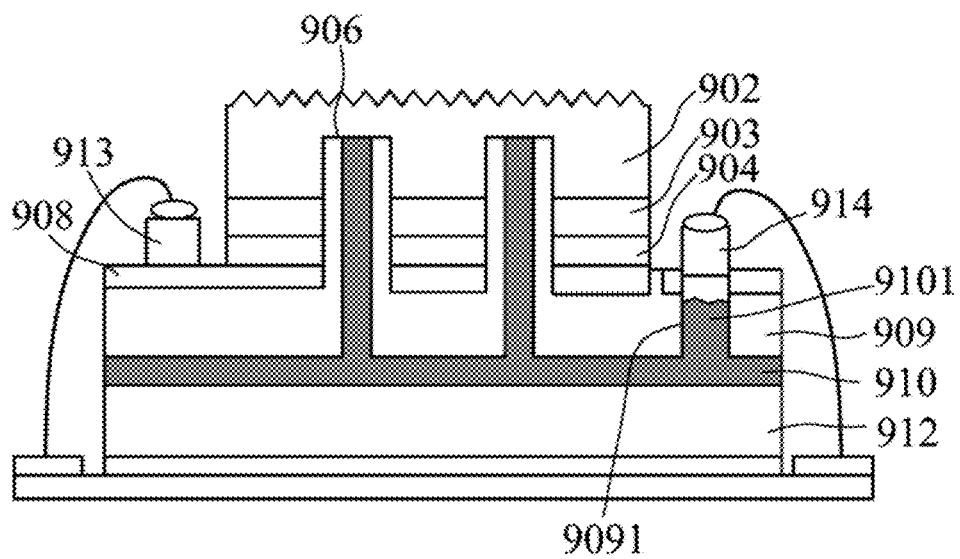
Figure 3:
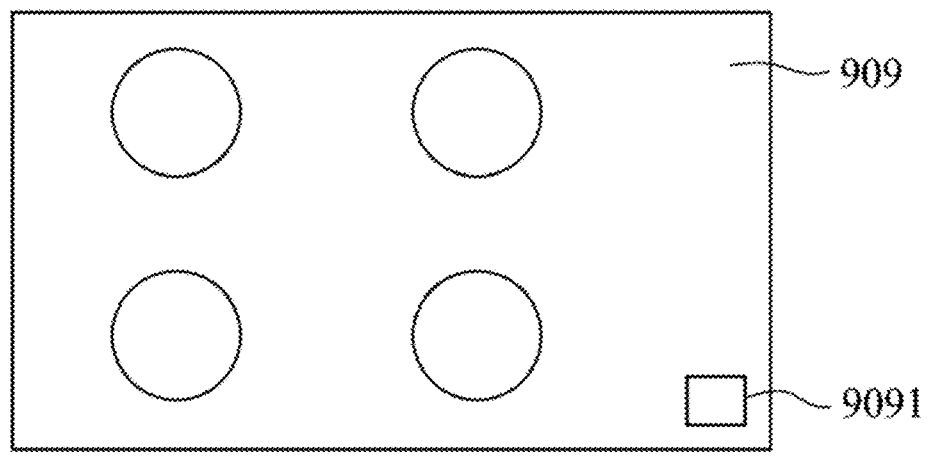
FIG. 3 is a schematic cross-sectional view illustrating an insulating layer of the conventional semiconductor light-emitting device.

It is noted that in the packaging product including the conventional semiconductor light-emitting device shown in FIGS. 1 and 2, the extending part 9101 of the second electrically connecting layer 910 is positioned exactly under the second electrode 914 (i.e., the projection of the second electrode 914 on the insulating layer 909 covering only the extending part 9101 without any insulating layer 909), and thus may not provide sufficient support for the second electrode 914 during wire bonding process due to the presence of voids that may be easily formed in the extending part 9101.

In contrast, the semiconductor light-emitting device according to this disclosure has the following advantages:
1. Since the projection of the second electrode 114 on the insulating layer 109 covers the portion 1092 of the insulating layer 109, the force exerted on the second electrode 114 (generated by the wire bonding electrode 304 (e.g., a gold ball) during wire bonding) can be effectively split by the portion 1092 of the insulating layer 109, so that the second electrode 114 that is at least partially supported by the insulating layer 109 would not be susceptible to damage (such as collapse and breakage) during wire bonding. Under such circumstance, even though some voids may be formed by non-uniform filling of the metallic material in the at least one through hole 1091, the resultant extending part 1102 of the second electrically connecting layer 110 may receive less force due to the support of the portion 1092 of the insulating layer 109, so as to reduce damage during wire bonding.
2. In contrast to the conventional semiconductor light-emitting device that requires the through hole 9091 to be formed with a relatively large diameter, in the semiconductor light-emitting device according to this disclosure, the at least one through hole 1091 is formed to have a loop cross section with a reduced width or a plurality of the through holes 1091 are formed with a reduced diameter, such that the extending part 1102 of the second electrically connecting layer 110 is able to be densely filled in the through hole (s) 1091, thereby decreasing the voids formed in the extending part 1102, which is also conducive for preventing the second electrode 114 from being damaged during wire bonding.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A semiconductor light-emitting device, comprising:
   a substrate;
   a connection structure that is disposed on said substrate, and that includes an insulating layer, a first electrically connecting layer disposed on said insulating layer opposite to said substrate, and a second electrically connecting layer disposed between said substrate and said insulating layer;

a semiconductor light-emitting unit that includes a first type semiconductor layer, a light-emitting layer, and a second type semiconductor layer sequentially disposed on said first electrically connecting layer opposite to said insulating layer; and a first electrode and a second electrode that are adapted for external wire bonding, and that are respectively electrically connected to said first type semiconductor layer through said first electrically connecting layer and electrically connected to said second type semiconductor layer through said second electrically connecting layer, wherein said insulating layer is formed with at least one through hole, said second electrically connecting layer including an extending part that extends through said at least one through hole to be electrically connected to said second electrode, such that a projection of said second electrode on said insulating layer covers a portion of said insulating layer.

2. The semiconductor light-emitting device of claim 1, wherein said at least one through hole has a loop cross section.

3. The semiconductor light-emitting device of claim 2, wherein said loop cross section of said at least one through hole is a closed-loop cross section, said portion of said insulating layer being separated from a remaining portion of said insulating layer by said second electrically connecting layer, an area of said portion of said insulating layer to an area of said projection of said second electrode on said insulating layer being present in a ratio of not smaller than 1:4.

4. The semiconductor light-emitting device of claim 3, wherein said ratio is not smaller than 1:2 and not greater than 1:1.

5. The semiconductor light-emitting device of claim 1, wherein said insulating layer is formed with a plurality of through holes, said extending part extending through said plurality of through holes.

6. The semiconductor light-emitting device of claim 1, wherein said extending part falls outside said projection of said second electrode on said insulating layer.

7. The semiconductor light-emitting device of claim 1, wherein said portion of said insulating layer is located at a center of said projection of said second electrode on said insulating layer for supporting said second electrode.

8. The semiconductor light-emitting device of claim 1, wherein an area of said projection of said second electrode on said insulating layer and an area of a cross-section of said at least one through hole are present in a ratio that ranges from 4:5 to 1:1.

9. The semiconductor light-emitting device of claim 1, wherein said at least one through hole is in one of a columnar shape and a cone shape.

10. The semiconductor light-emitting device of claim 1, wherein a projection of said extending part on said insulating layer partially overlaps with said projection of said second electrode on said insulating layer.

11. The semiconductor light-emitting device of claim 1, wherein an area of said projection of said second electrode on said insulating layer having a diameter that is at least half of a distance between two opposite ends of said projection of said second electrode overlaps with said portion of said insulating layer.

12. The semiconductor light-emitting device of claim 1, wherein said semiconductor light-emitting unit further includes at least one recess that is defined by a recess-defining wall and that is exposed from the first electrically connecting layer, said at least one recess extending through said first type semiconductor layer and said light-emitting layer, and terminating at and exposing said second type semiconductor layer;

said second electrically connecting layer further extends into said at least one recess to electrically contact with said second type semiconductor layer; and said insulating layer further covers said recess-defining wall, and is disposed between and electrically isolates said second electrically connecting layer and said semiconductor light-emitting unit.

13. The semiconductor light-emitting device of claim 1, wherein a distance of a bottom end of said first electrode to said substrate is equal to a distance of a bottom end of said second electrode to said substrate.

14. The semiconductor light-emitting device of claim 1, wherein said insulating layer has a thickness that is measured from said first electrically connecting layer to said second electrically connecting layer and that ranges from 100 nm to 5000 nm.

15. The semiconductor light-emitting device of claim 14, wherein said thickness of said insulating layer ranges from 500 nm to 5000 nm.

16. The semiconductor light-emitting device of claim 1, wherein said insulating layer has a Mohs hardness that is not smaller than 6.

17. The semiconductor light-emitting device of claim 1, wherein each of said first electrically connecting layer and said second electrically connecting layer is made from a metallic material.

18. The semiconductor light-emitting device of claim 17, wherein each of said first electrically connecting layer and said second electrically connecting layer is formed as one of a single layer structure and a multi-layered structure.

19. The semiconductor light-emitting device of claim 1, wherein said first electrically connecting layer includes an ohmic contact sublayer disposed on said first type semiconductor layer, and a reflection sublayer covering said ohmic contact sublayer.

20. The semiconductor light-emitting device of claim 1, further comprising a bonding layer disposed between said substrate and said second electrically connecting layer.

21. The semiconductor light-emitting device of claim 1, wherein said extending part of said second electrically connecting layer includes one of a metal, a metal alloy, and a combination thereof.

22. The semiconductor light-emitting device of claim 1, wherein said insulating layer is made of a material selected from a group consisting of a nitride, an oxide, a fluoride, and combinations thereof.

23. The semiconductor light-emitting device of claim 1, wherein said semiconductor light-emitting unit and said first and second electrodes are located on a same side of said substrate.

* * * * *